United States Patent
Maruyama

(10) Patent No.: US 12,448,485 B2
(45) Date of Patent: Oct. 21, 2025

(54) PHOTOSENSITIVE RESIN COMPOSITION, PHOTOSENSITIVE RESIN COATING, PHOTOSENSITIVE DRY FILM, PATTERN FORMATION METHOD

(71) Applicant: Shin-Etsu Chemical Co., Ltd., Tokyo (JP)

(72) Inventor: Hitoshi Maruyama, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 649 days.

(21) Appl. No.: 17/792,210

(22) PCT Filed: Jan. 13, 2021

(86) PCT No.: PCT/JP2021/000738
§ 371 (c)(1),
(2) Date: Jul. 12, 2022

(87) PCT Pub. No.: WO2021/149542
PCT Pub. Date: Jul. 29, 2021

(65) Prior Publication Data
US 2023/0076103 A1    Mar. 9, 2023

(30) Foreign Application Priority Data
Jan. 24, 2020   (JP) .................... 2020-010120

(51) Int. Cl.
| C08G 77/14 | (2006.01) |
| C08G 77/42 | (2006.01) |
| C08G 77/52 | (2006.01) |
| C08L 63/04 | (2006.01) |
| G03F 7/075 | (2006.01) |
| H01L 21/02 | (2006.01) |

(52) U.S. Cl.
CPC .............. *C08G 77/14* (2013.01); *C08G 77/42* (2013.01); *C08G 77/52* (2013.01); *C08L 63/04* (2013.01); *G03F 7/0757* (2013.01); *H01L 21/02126* (2013.01); *H01L 21/02216* (2013.01)

(58) Field of Classification Search
CPC ......... C08G 77/14; C08G 77/42; C08G 77/52
See application file for complete search history.

(56) References Cited

U.S. PATENT DOCUMENTS

| 5,457,003 A | * | 10/1995 | Tanaka | ................ G03F 7/0757 430/176 |
| 10,503,067 B2 | * | 12/2019 | Maruyama | .............. G03F 7/039 |
| 2002/0055550 A1 | | 5/2002 | Kato et al. | |
| 2008/0182087 A1 | | 7/2008 | Kato et al. | |
| 2011/0316116 A1 | | 12/2011 | Sato et al. | |
| 2016/0357105 A1 | | 12/2016 | Asai et al. | |
| 2016/0358833 A1 | | 12/2016 | Soga et al. | |
| 2018/0107115 A1 | | 4/2018 | Asai et al. | |
| 2019/0354014 A1 | | 11/2019 | Maruyama et al. | |
| 2020/0026190 A1 | * | 1/2020 | Maruyama | ................ G03F 7/16 |
| 2023/0030194 A1 | * | 2/2023 | Maruyama | .............. C08G 77/20 |

FOREIGN PATENT DOCUMENTS

| CN | 107430335 A | * | 12/2017 | ............. C08G 69/26 |
| CN | 108388082 A | * | 8/2018 | ............. C08G 73/22 |
| EP | 3309615 A1 | | 4/2018 | |
| EP | 3597694 A1 | | 1/2020 | |
| JP | 59-84238 A | | 5/1984 | |
| JP | 4-253059 A | | 9/1992 | |
| JP | 08320562 A | * | 12/1996 | |
| JP | 2001-22055 A | | 1/2001 | |
| JP | 2002-88158 A | | 3/2002 | |
| JP | 2007-122029 A | | 5/2007 | |
| JP | 2008-184571 A | | 8/2008 | |
| JP | 2014-142458 A | | 8/2014 | |
| KR | 20120044903 A | * | 5/2012 | |
| WO | 2010/119647 A1 | | 10/2010 | |

OTHER PUBLICATIONS

Machine translation of JP 2007-122029 (no date) (Year: 0000).*
Machine translation of JP 04-253059 (no date) (Year: 0000).*
Extended (Supplementary) European Search Report dated Feb. 5, 2024 issued in counterpart EP Application No. 21743942.1. (11 pages).
International Search Report dated Apr. 6, 2021, issued in counterpart International Application No. PCT/JP2021/000738 (3 pages).

\* cited by examiner

*Primary Examiner* — Amanda C. Walke
(74) *Attorney, Agent, or Firm* — WHDA, LLP

(57) ABSTRACT

Provided is a photosensitive resin composition that includes: a silicone resin (A) having an epoxy group and/or a phenolic hydroxyl group; an alkyl phenol novolac resin (B) indicated by formula (B); and a photoacid generator (C).

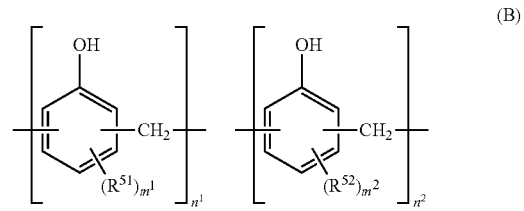

(In the formula, $R^{51}$ is a C1-9 saturated hydrocarbyl group. $R^{52}$ is a C10-25 saturated hydrocarbyl group. $n^1$ and $n^2$ are numbers that fulfil $0 \leq n^1 < 1$, $0 < n^2 \leq 1$, and $n^1 + n^2 = 1$. $m^1$ represents an integer from 0 to 3 and $m^2$ represents an integer from 1 to 3.)

13 Claims, No Drawings

PHOTOSENSITIVE RESIN COMPOSITION, PHOTOSENSITIVE RESIN COATING, PHOTOSENSITIVE DRY FILM, PATTERN FORMATION METHOD

TECHNICAL FIELD

This invention relates to a photosensitive resin composition, photosensitive resin coating, photosensitive dry film, and pattern forming process.

BACKGROUND ART

In the prior art, photosensitive protective films for semiconductor devices and photosensitive insulating films for multilayer printed circuit boards are formed of photosensitive polyimide compositions, photosensitive epoxy resin compositions, photosensitive silicone compositions, and the like. As the photosensitive material applied for the protection of such substrates and circuits, Patent Document 1 discloses a photosensitive silicone composition having improved flexibility. This photosensitive silicone composition is curable at low temperature and forms a coating which is fully reliable with respect to moisture resistant adhesion and other properties, but is less resistant against chemicals such as photoresist strippers having a high dissolving power, typically N-methyl-2-pyrrolidone.

To overcome the problem, Patent Document 2 proposes a photosensitive silicone composition based on a silphenylene structure-containing silicone polymer. This composition is improved in chemical resistance against photoresist strippers and the like, but still has the problem that the cured coating peels from the substrate or cracks in a thermal cycling test (repeating 1,000 cycles a test of holding at −25° C. for 10 minutes and holding at 125° C. for 10 minutes). A further improvement in reliability is desired.

PRIOR ART DOCUMENTS

Patent Documents

Patent Document 1: JP-A 2002-088158
Patent Document 2: JP-A 2008-184571

SUMMARY OF INVENTION

Technical Problem

An object of the invention, which has been made under the above-mentioned circumstances, is to provide a photosensitive resin composition, photosensitive resin coating, and photosensitive dry film, which give a cured resin coating or resin layer that can be simply processed in thick film form to define a fine size pattern, has improved film properties including crack resistance and adhesion to substrates, typically substrates for use in electronic parts and semiconductor devices and substrates for use in circuit boards, and is thus reliable as a protective film for electric and electronic parts and a film for bonding substrates. Another object is to provide a pattern forming process using the foregoing.

Solution to Problem

Making extensive investigations to attain the above object, the inventor has found that the object can be attained by a photosensitive resin composition comprising a silicone resin containing an epoxy group and/or phenolic hydroxy group, an alkyl phenol novolak resin, and a photoacid generator. The invention is predicated on this finding.

Accordingly, the invention provides a photosensitive resin composition, photosensitive resin coating, photosensitive dry film, and pattern forming process, as defined below.

1. A photosensitive resin composition comprising
   (A) a silicone resin containing an epoxy group and/or phenolic hydroxy group,
   (B) an alkyl phenol novolak resin having the formula (B):

[Chem. 1]

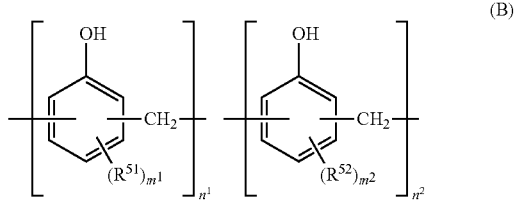

wherein $R^{51}$ is a $C_1$-$C_9$ saturated hydrocarbyl group, $R^{52}$ is a $C_{10}$-$C_{25}$ saturated hydrocarbyl group, $n^1$ and $n^2$ are numbers in the range: $0 \leq n^1 < 1$, $0 < n^2 \leq 1$, and $n^1 + n^2 = 1$, $m^1$ is an integer of 0 to 3, and is an integer of 1 to 3, and
   (C) a photoacid generator.

2. The photosensitive resin composition of 1 wherein the silicone resin (A) has the formula (A):

[Chem. 2]

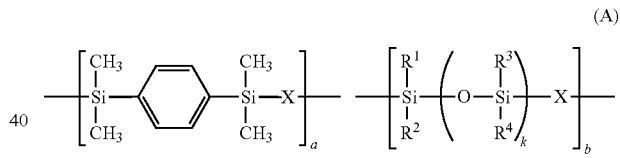

wherein $R^1$ to $R^4$ are each independently a $C_1$-$C_8$ monovalent hydrocarbon group, k is an integer of 1 to 600, a and b are numbers in the range: $0 < a < 1$, $0 < b < 1$, and $a+b=1$, and X is a divalent organic group containing an epoxy group and/or phenolic hydroxy group.

3. The photosensitive resin composition of 2 wherein the silicone resin (A) comprises repeat units having the formulae (a1) to (a4) and (b1) to (b4):

[Chem. 3]

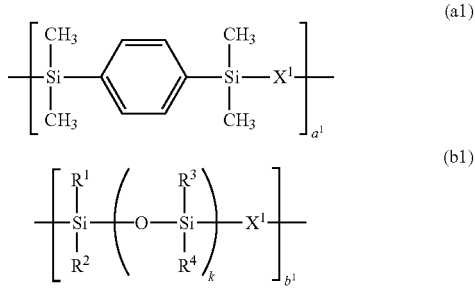

-continued (a2)
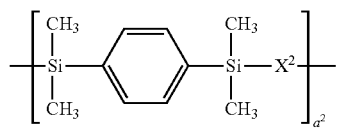

(b2)
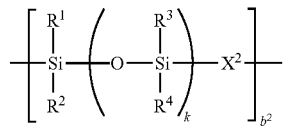

(a3)
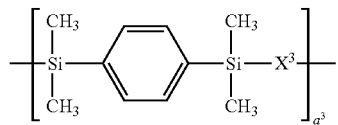

(b3)
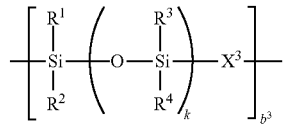

(a4)
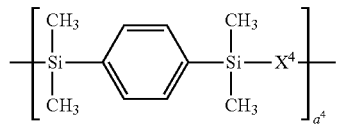

(b4)
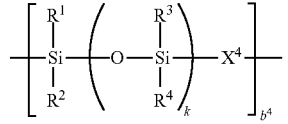

wherein $R^1$ to $R^4$ are each independently a $C_1$-$C_8$ monovalent hydrocarbon group, k is an integer of 1 to 600, $a^1$ to $a^4$ and $b^1$ to $b^4$ are numbers in the range: $0 \leq a^1 < 1$, $0 \leq a^2 < 1$, $0 \leq a^3 < 1$, $0 \leq a^4 < 1$, $0 \leq b^1 < 1$, $0 \leq b^2 < 1$, $0 \leq b^3 < 1$, $0 \leq b^4 < 1$, $0 < a^1 + a^2 + a^3 + a^4 < 1$, $0 < b^1 + b^2 + b^3 < 1$, $a^1 + a^2 + a^3 + a^4 + b^1 + b^2 + b^3 + b^4 = 1$, $X^1$ is a divalent group having the following formula (X1), $X^2$ is a divalent group having the following formula (X2), $X^3$ is a divalent to group having the following formula (X3), $X^4$ is a divalent group having the following formula (X4),

[Chem. 4]

(X1)
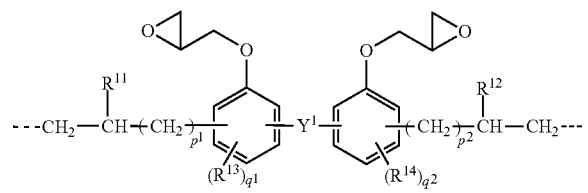

wherein $Y^1$ is a single bond, methylene, propane-2,2-diyl, 1,1,1,3,3,3-hexafluoropropane-2,2-diyl or fluorene-9,9-diyl, $R^{11}$ and $R^{12}$ are each independently hydrogen or methyl, $R^{13}$ and $R^{14}$ are each independently a $C_1$-$C_4$ saturated hydrocarbyl or $C_1$-$C_4$ saturated hydrocarbyloxy group, $p^1$ and $p^2$ are each independently an integer of 0 to 7, $q^1$ and $q^2$ are each independently an integer of 0 to 2, the broken line designates a valence bond,

[Chem. 5]

(X2)
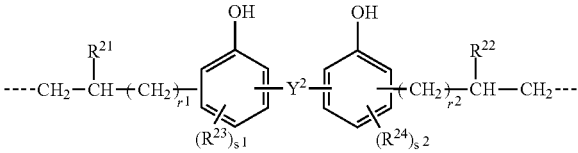

wherein $Y^2$ is a single bond, methylene, propane-2,2-diyl, 1,1,1,3,3,3-hexafluoropropane-2,2-diyl or fluorene-9,9-diyl, $R^{21}$ and $R^{22}$ are each independently hydrogen or methyl, $R^{23}$ and $R^{24}$ are each independently a $C_1$-$C_4$ saturated hydrocarbyl or $C_1$-$C_4$ saturated hydrocarbyloxy group, $r^1$ and $r^2$ are each independently an integer of 0 to 7, $s^1$ and $s^2$ are each independently an integer of 0 to 2, the broken line designates a valence bond,

[Chem. 6]

(X3)
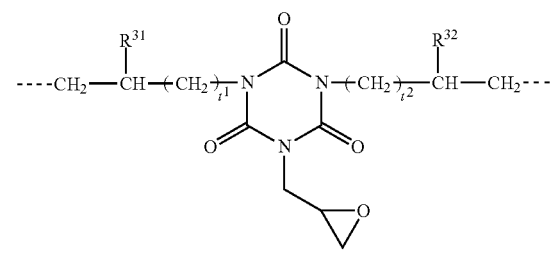

wherein $R^{31}$ and $R^{32}$ are each independently hydrogen or methyl, $t^1$ and $t^2$ are each independently an integer of 0 to 7, the broken line designates a valence bond,

[Chem. 7]

(X4)
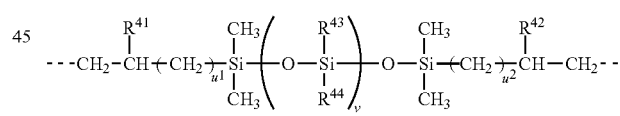

wherein $R^{41}$ and $R^{42}$ are each independently hydrogen or methyl, $R^{43}$ and $R^{44}$ are each independently a $C_1$-$C_8$ hydrocarbyl group, $u^1$ and $u^2$ are each independently an integer of 0 to 7, v is an integer of 0 to 600, and the broken line designates a valence bond.

4. The photosensitive resin composition of any one of 1 to 3 wherein the amount of the alkyl phenol novolak resin as component (B) is 3 to 100 parts by weight per 100 parts to by weight of component (A).

5. The photosensitive resin composition of any one of 1 to 4, further comprising (D) a crosslinker.

6. The photosensitive resin composition of 5 wherein the crosslinker (D) is at least one compound selected from a nitrogen-containing compound selected from melamine, guanamine, glycoluril and urea compounds, having on the average at least two methylol and/or alkoxymethyl groups in the molecule, an amino condensate modified with formaldehyde or formaldehyde-alcohol, a phenol compound having on the average at least two methylol or alkoxymethyl groups in the molecule, and an epoxy compound having on the average at least two epoxy groups in the molecule.

7. The photosensitive resin composition of any one of 1 to 6, further comprising (E) a solvent.

8. A photosensitive resin coating obtained from the photosensitive resin composition of any one of 1 to 7.

9. A photosensitive dry film comprising a support and the photosensitive resin coating of 8 thereon.

10. A pattern forming process comprising the steps of
   (i) applying the photosensitive resin composition of any one of 1 to 7 onto a substrate to form a photosensitive resin coating thereon,
   (ii) exposing the photosensitive resin coating to radiation, and
   (iii) developing the exposed resin coating in a developer to form a pattern of the resin coating.

11. A pattern forming process comprising the steps of:
   (i') using the photosensitive dry film of 9 to form the photosensitive resin coating on a substrate,
   (ii) exposing the photosensitive resin coating to radiation, and
   (iii) developing the exposed resin coating in a developer to form a pattern of the resin coating.

12. The pattern forming process of 10 or 11, further comprising (iv) post-curing the patterned resin coating resulting from the development step at a temperature of 100 to 250° C.

13. The photosensitive resin composition of any one of 1 to 7 which is a material adapted to form a coating for protecting electric and electronic parts.

14. The photosensitive resin composition of any one of 1 to 7 which is a material adapted to form a substrate-bonding coating for bonding two substrates.

Advantageous Effects of Invention

The photosensitive resin composition of the invention is able to form a coating having a widely varying range of thickness, has satisfactory storage stability, and is able to form a small size pattern in thick film form having improved perpendicularity by the pattern forming process defined herein. The coating obtained from the photosensitive resin composition and the photosensitive dry film of the invention has improved film properties including chemical resistance against photoresist strippers or the like, adhesion to substrates, electronic parts, semiconductor devices, especially substrates for use in circuit boards, mechanical properties, electric insulation, and copper migration resistance. Also, the coating is fully reliable as an insulating protective film and advantageously used as a material adapted to form a protective film for protecting electric and electronic parts such as circuit boards, semiconductor devices, and display devices, and a material adapted to form a film for bonding substrates.

DESCRIPTION OF EMBODIMENTS

Photosensitive Resin Composition

The invention provides a photosensitive resin composition comprising (A) a silicone resin containing an epoxy group and/or phenolic hydroxy group, (B) an alkyl phenol novolak resin, and (C) a photoacid generator.

(A) Silicone Resin

Component (A) is a silicone resin containing an epoxy group or phenolic hydroxy group or both in the molecule. The silicone resin is preferably one having the formula (A), but not limited thereto.

[Chem. 8]

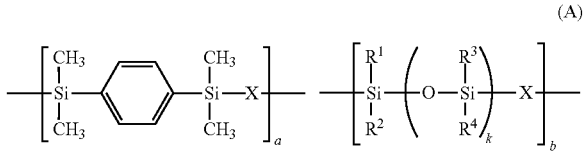

In formula (A), $R^1$ to $R^4$ are each independently a $C_1$-$C_8$, preferably $C_1$-$C_6$ hydrocarbyl group; k is an integer of 1 to 600, preferably 1 to 400, more preferably 1 to 200; "a" and "b" are numbers in the range: $0<a<1$, $0<b<1$, and $a+b=1$. X is a divalent organic group containing an epoxy group and/or phenolic hydroxy group.

The hydrocarbyl group may be straight, branched or cyclic. Examples thereof include alkyl groups such as methyl, ethyl, propyl, hexyl and structural isomers thereof, cyclic saturated hydrocarbyl groups such as cyclohexyl, and aryl groups such as phenyl. Of these, methyl and phenyl are preferred for availability of starting reactants.

Most preferably, the silicone resin having formula (A) comprises repeat units having the formulae (a1) to (a4) and (b1) to (b4). These units are also referred to as repeat units (a1) to (a4) and (b1) to (b4), hereinafter.

[Chem. 9]

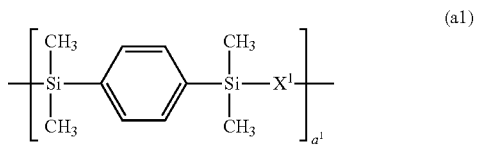

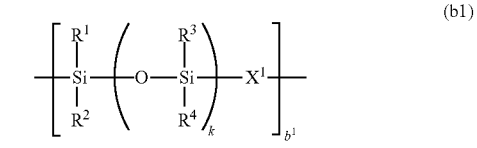

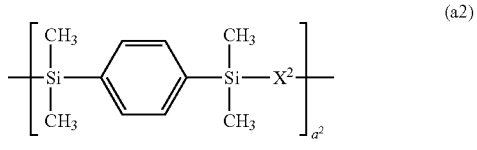

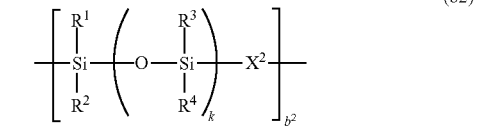

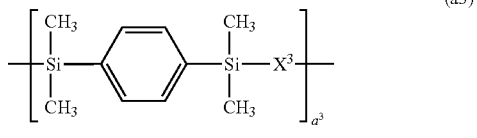

(b3)

$$\left[\begin{array}{c}R^1\\|\\-Si-\\|\\R^2\end{array}\left(O-\begin{array}{c}R^3\\|\\Si\\|\\R^4\end{array}\right)_k X^3\right]_{b3}$$

(a4)

$$\left[\begin{array}{c}CH_3\\|\\-Si-\\|\\CH_3\end{array}\!\!-\!\!\!\bigcirc\!\!\!-\!\!\begin{array}{c}CH_3\\|\\Si\\|\\CH_3\end{array}\!\!-\!\!X^4\right]_{a4}$$

(b4)

$$\left[\begin{array}{c}R^1\\|\\-Si-\\|\\R^2\end{array}\left(O-\begin{array}{c}R^3\\|\\Si\\|\\R^4\end{array}\right)_k X^4\right]_{b4}$$

Herein $R^1$ to $R^4$ and k are as defined above.

In formulae (a1) and (b1), $X^1$ is a divalent group having the following formula (X1).

[Chem. 10]

(X1)

$$\text{---}CH_2\text{---}\underset{R^{11}}{\underset{|}{CH}}\text{---}(CH_2)_{p^1}\text{---}\!\!\bigcirc\!\!\!\underset{(R^{13})_{q^1}}{\phantom{X}}\!\!\!-Y^1-\!\!\bigcirc\!\!\!\underset{(R^{14})_{q^2}}{\phantom{X}}\!\!\!-(CH_2)_{p^2}\text{---}\underset{R^{12}}{\underset{|}{CH}}\text{---}CH_2\text{---}$$

Herein the broken line designates a valence bond.

In formula (X1), $Y^1$ is a single bond, methylene, propane-2,2-diyl, 1,1,1,3,3,3-hexafluoroproane-2,2-diyl or fluorene-9,9-diyl. $R^{11}$ and $R^{12}$ are each independently hydrogen or methyl. $R^{13}$ and $R^{14}$ are each independently a $C_1$-$C_4$ saturated hydrocarbyl group or $C_1$-$C_4$ saturated hydrocarbyloxy group. The subscripts $p^1$ and $p^2$ are each independently an integer of 0 to 7, $q^1$ and $q^2$ are each independently an integer of 0 to 2.

The saturated hydrocarbyl group may be straight, branched or cyclic. Examples thereof include alkyl groups such as methyl, ethyl, propyl, butyl and structural isomers thereof, and cyclic saturated hydrocarbyl groups such as cyclopropyl and cyclobutyl. The saturated hydrocarbyloxy group may be straight, branched or cyclic. Examples thereof include alkoxy groups such as methoxy, ethoxy, propoxy, butoxy and structural isomers thereof, and cyclic saturated hydrocarbyloxy groups such as cyclopropyloxy and cyclobutyloxy.

In formulae (a2) and (b2), $X^2$ is a divalent group having the following formula (X2).

[Chem. 11]

(X2)

$$\text{---}CH_2\text{---}\underset{R^{21}}{\underset{|}{CH}}\text{---}(CH_2)_{r^1}\text{---}\!\!\bigcirc\!\!\!\underset{(R^{23})_{s^1}}{\phantom{X}}\!\!\!\underset{OH}{\phantom{X}}-Y^2-\!\!\bigcirc\!\!\!\underset{(R^{24})_{s^2}}{\phantom{X}}\!\!\!\underset{OH}{\phantom{X}}-(CH_2)_{r^2}\text{---}\underset{R^{22}}{\underset{|}{CH}}\text{---}CH_2\text{---}$$

Herein the broken line designates a valence bond.

In formula (X2), $Y^2$ is a single bond, Methylene, propane-2,2-diyl, 1,1,1,3,3,3-hexafluoropropane-2,2-diyl or fluorene-9,9-diyl. $R^{21}$ and $R^{22}$ are each independently hydrogen or methyl. $R^{23}$ and $R^{24}$ are each independently a $C_1$-$C_4$ saturated hydrocarbyl group or $C_1$-$C_4$ saturated hydrocarbyloxy group. The subscripts $r^1$ and $r^2$ are each independently an integer of 0 to 7, $s^1$ and s2 are each independently an integer of 0 to 2. Examples of the saturated hydrocarbyl and saturated hydrocarbyloxy groups are as exemplified above for $R^{13}$ and $R^{14}$.

In formulae (a3) and (b3), $X^3$ is a divalent group having the following formula (X3).

[Chem. 12]

(X3)

$$\text{---}CH_2\text{---}\underset{R^{31}}{\underset{|}{CH}}\text{---}(CH_2)_{t^1}\text{---}N\!\!\underset{\text{isocyanurate ring}}{\phantom{X}}\!\!N\text{---}(CH_2)_{t^2}\text{---}\underset{R^{32}}{\underset{|}{CH}}\text{---}CH_2\text{---}$$

Herein the broken line designates a valence bond.

In formula (X3), $R^{31}$ and $R^{32}$ are each independently hydrogen or methyl. The subscripts $t^1$ and $t^2$ are each independently an integer of 0 to 7.

In formulae (a4) and (b4), $X^4$ is a divalent group having the following formula (X4).

[Chem. 13]

(X4)

$$\text{---}CH_2\text{---}\underset{R^{41}}{\underset{|}{CH}}\text{---}(CH_2)_{u^1}\text{---}\underset{CH_3}{\underset{|}{Si}}\text{---}\left(O-\underset{R^{44}}{\underset{|}{\overset{CH_3}{Si}}}\right)_v\text{---}O\text{---}\underset{CH_3}{\underset{|}{Si}}\text{---}(CH_2)_{u^2}\text{---}\underset{R^{42}}{\underset{|}{CH}}\text{---}CH_2\text{---}$$

Herein the broken line designates a valence bond.

In formula (X4), $R^{41}$ and $R^{42}$ are each independently hydrogen or methyl. $R^{43}$ and $R^{44}$ are each independently a $C_1$-$C_8$ hydrocarbyl group. The subscripts $u^1$ and $u^2$ are each independently an integer of 0 to 7, and v is an integer of 0 to 600, preferably 0 to 400, more preferably 0 to 200. Examples of the hydrocarbyl group are as exemplified above for $R^1$ to $R^4$.

The silicone resin as component (A) preferably has a weight average molecular weight (Mw) of 3,000 to 500,000, more preferably 5,000 to 200,000. It is noted that Mw as used herein is measured by gel permeation chromatography (GPC) versus polystyrene standards using tetrahydrofuran (THF) as the elute.

In formulae (a1) to (a4) and (b$_1$) to (b4), $a^1$ to $a^4$ and $b^1$ to $b^4$ are numbers in the range: $0 \le a^1 < 1$, $0 \le a^2 < 1$, $0 \le a^3 < 1$, $0 \le a^4 < 1$, $0 \le b^1 < 1$, $0 \le b^2 < 1$, $0 \le b^3 < 1$, $0 \le b^4 < 1$, $0 < a^1 + a^2 + a^3 < 1$, $0 < b^1 + b^2 + b^3 < 1$, and $a^1 + a^2 + a^3 + a^4 + b^1 + b^2 + b^3 + b^4 = 1$; preferably numbers in the range: $0 \le a^1 \le 0.8$, $0 \le a^2 \le 0.8$, $0 \le a^3 \le 0.8$, $0 \le a^4 \le 0.8$, $0 \le b^1 \le 0.95$, $0 \le b^2 \le 0.95$, $0 \le b^3 \le 0.95$, $0 \le b^4 \le 0.95$, $0.05 \le a^1 + a^2 + a^3 \le 0.8$, $0.2 \le b^1 + b^2 + b^3 \le 0.95$, and $a^1 + a^2 + a^3 + a^4 + b^1 + b^2 + b^3 + b^4 = 1$; more preferably numbers in the range: $0 \le a^1 \le 0.7$, $0 \le a^2 \le 0.7$, $0 \le a^3 \le 0.7$, $0 \le a^4 \le 0.7$, $0 \le b^1 \le 0.9$, $0 \le b^2 \le 0.9$, $0 \le b^3 \le 0.9$, $0 \le b^4 \le 0.9$, $0.1 \le a^1 + a^2 + a^3 \le 0.7$, $0.3 \le b^1 + b^2 + b^3 \le 0.9$, and $a^1 + a^2 + a^3 + a^4 + b^1 + b^2 + b^3 + a^4 = 1$.

The above-mentioned repeat units may be arranged randomly or arranged as a block polymer. When each repeat unit includes two or more siloxane units, the siloxane units may be all the same or of two or more different types. When siloxane units of two or more different types are included, siloxane units may be randomly arranged, or plural blocks each consisting of siloxane units of the same type may be included. The silicone resin preferably has a silicone (siloxane unit) content of 30 to 80% by weight.

The silicone resin as component (A) functions to provide a film-forming ability. A resin film obtained therefrom has excellent adhesion to laminates, substrates, and the like, a satisfactory pattern-forming ability, crack resistance, and heat resistance.

The silicone resin as component (A) may be used alone or in admixture of two or more.

Preparation of Silicone Resin (A)

The silicone resin as component (A) may be prepared by addition polymerization of a compound having the formula (1), a compound having the formula (2), at least one compound selected from a compound having the formula (3), a compound having the formula (4), and a compound having the formula (5), and optionally, a compound having the formula (6), all shown below, in the presence of a metal catalyst.

[Chem. 14]

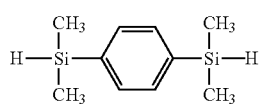
(1)

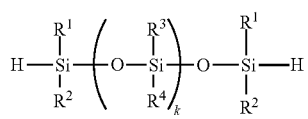
(2)

Herein, $R^1$ to $R^4$ and k are as defined above.

[Chem. 15]

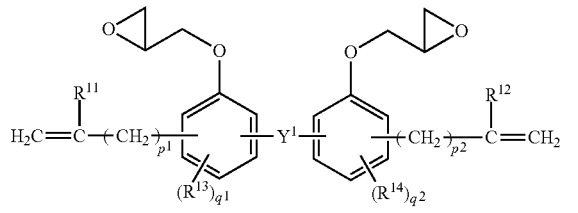
(3)

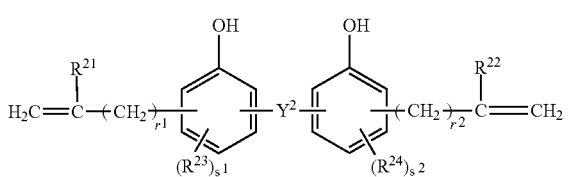
(4)

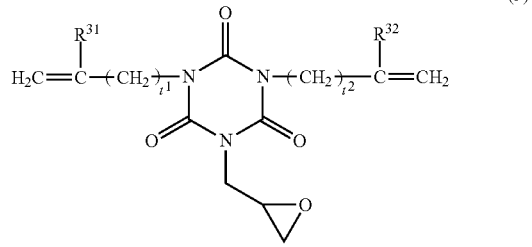
(5)

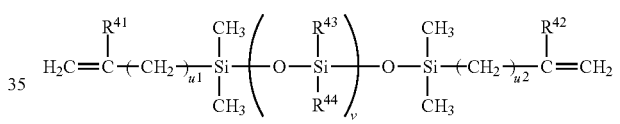
(6)

Herein $R^{11}$ to $R^{14}$, $R^{21}$ to $R^{24}$, $R^{31}$, $R^{32}$, $R^{41}$ to $R^{44}$, $Y^1$, $Y^2$, $p^1$, $p^2$, $q^1$, $q^2$, $r^1$, $r^2$, $s^1$, $s^2$, $t^1$, $t^2$, $u^1$, $u^2$, and v are as defined above.

Examples of the metal catalyst include platinum group metals alone such as platinum (including platinum black), rhodium and palladium; platinum chlorides, chloroplatinic acids and chloroplatinates such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$ and $Na_2HPtCl_4 \cdot xH_2O$, wherein x is preferably an integer of 0 to 6, more preferably 0 or 6; alcohol-modified chloroplatinic acids as described in U.S. Pat. No. 3,220,972; chloroplatinic acid-olefin complexes as described in U.S. Pat. No. 3,159,601, U.S. Pat. No. 3,159.662 and U.S. Pat. No. 3,775,452, supported catalysts comprising platinum group metals such as platinum black and palladium on supports of alumina, silica and carbon; rhodium-olefin complexes; chlorotris(triphenylphosphine)rhodium (known as Wilkinson's catalyst); and complexes of platinum chlorides, chloroplatinic acids and chloroplatinates with vinyl-containing siloxanes, specifically vinyl-containing cyclic siloxanes.

The catalyst is used in a catalytic amount, which is preferably 0.001 to 0.1 part by weight, more preferably 0.01 to 0.1 part by weight per 100 parts by weight in total of the starting compounds.

In the addition polymerization reaction, a solvent may be used if desired. Suitable solvents are hydrocarbon solvents such as toluene and xylene.

The polymerization temperature is preferably 40 to 150° C., more preferably 60 to 120° C., from the aspects that the catalyst may not be deactivated and the polymerization be completed within a short time. While the polymerization time varies with the type and amount of the resulting resin, it is preferably about 0.5 to about 100 hours, more preferably about 0.5 to about 30 hours for preventing moisture entry into the polymerization system. After the completion of reaction, the solvent if any is distilled off, obtaining the silicone resin as component (A).

The reaction procedure is not particularly limited. For example, where a compound having formula (1) and a compound having formula (2) are reacted with at least one compound selected from a compound having formula (3), a compound having formula (4), and a compound having formula (5), and optionally a compound having formula (6), one preferred procedure is by first mixing at least one compound selected from the compound having formula (3), the compound having formula (4), and the compound having formula (5), and optionally the compound having formula (6), heating the mixture, adding a metal catalyst to the mixture, and then adding the compound having formula (1) and the compound having formula (2) dropwise over 0.1 to 5 hours.

The compounds are preferably combined in such amounts that a molar ratio of hydrosilyl groups on the compound having formula (1) and the compound having formula (2) to the total of alkenyl groups on the at least one compound selected from the compounds having formulae (3), (4), and (5), and the optional compound having formula (6) may range from 0.67/1 to 1.67/1, more preferably from 0.83/1 to 1.25/1.

The Mw of the resulting resin may be controlled using a molecular weight control agent such as a monoallyl compound (e.g., o-allylphenol), monohydrosilane (e.g., triethylhydrosilane) or monohydrosiloxane.

(B) Alkyl Phenol Novolak Resin

Component (B) is an alkyl phenol novolak resin having the formula (B).

[Chem. 16]

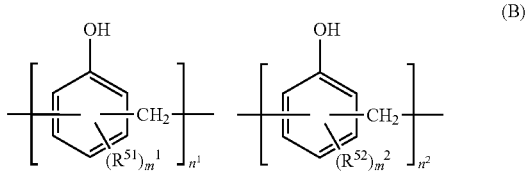

(B)

In formula (B), $R^{51}$ is a $C_1$-$C_9$ saturated hydrocarbyl group. $R^{52}$ is a $C_{10}$-$C_{25}$ saturated hydrocarbyl group. Due to the carbon count of $R^{52}$ which is 10 or more, a cured film having satisfactory toughness is obtained. Due to the carbon count of $R^{52}$ which is 25 or less, a cured product maintains heat resistance.

The $C_1$-$C_9$ saturated hydrocarbyl group may be straight, branched or cyclic, and examples thereof include methyl, ethyl, propyl, butyl, pentyl, hexyl, heptyl, octyl, nonyl, and structural isomers thereof. The $C_{10}$-$C_{25}$ saturated hydrocarbyl group may be straight, branched or cyclic, and examples thereof include decyl, undecyl, n-dodecyl, tridecyl, tetradecyl, pentadecyl, hexadecyl, heptadecyl, octadecyl, nonadecyl, icosyl, henicosyl, docosyl, tricosyl, tetracosyl, pentacosyl, and structural isomers thereof.

In formula (B), $n^1$ and $n^2$ are numbers in the range: $0 \le n^1 < 1$, $0 < n^2 \le 1$, and $n^1 + n^2 = 1$, $m^1$ is an integer of 0 to 3, and $m^2$ is an integer of 1 to 3.

The alkyl phenol novolak resin preferably has a weight average molecular weight (Mw) of 500 to 2,000, more preferably 800 to 1,600.

For the alkyl phenol novolak resin, commercially available resins, for example, ELP series resins ELP30, ELP40H and ELPC75 (Gun Ei Chemical Industry Co., Ltd.) are useful.

Component (B) is preferably used in an amount of 3 to 100 parts by weight, more preferably 3 to 50 parts by weight per 100 parts by weight of component (A). As long as the amount of component (B) is in the range, a better coating is obtained in the fabrication of a dry film. Component (B) may be used alone or in admixture of two or more.

(C) Photoacid Generator

The photoacid generator as component (C) is not particularly limited as long as it is decomposed to generate an acid upon light exposure. A compound which is decomposed to generate an acid upon exposure to light of wavelength 190 to 500 nm is preferred. The PAG serves as a curing catalyst. Since the photosensitive resin composition of the invention is highly compatible with the PAG, the PAG may be selected from a wide variety of such compounds.

Suitable PAGs include onium salts, diazomethane derivatives, glyoxime derivatives, β-ketosulfone derivatives, disulfone derivatives, nitrobenzyl sulfonate derivatives, sulfonic acid ester derivatives, imido-yl sulfonate derivatives, oxime sulfonate derivatives, and imino sulfonate derivatives.

Exemplary onium salts include sulfonium salts having the formula (C1) and iodonium salts having the formula (C2).

[Chem. 17]

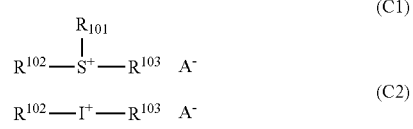

In formulae (C1) and (C2), $R^{101}$ to $R^{105}$ are each independently an optionally substituted $C_1$-$C_{12}$ saturated hydrocarbyl group, an optionally substituted $C_6$-$C_{12}$ aryl group, or an optionally substituted $C_7$-$C_{12}$ aralkyl group. A is a non-nucleophilic counter ion.

The saturated hydrocarbyl group may be straight, branched or cyclic. Examples thereof include alkyl groups such as methyl, ethyl, propyl, butyl, pentyl, hexyl, and structural isomers thereof; and cyclic saturated hydrocarbyl groups such as cyclopropyl, cyclobutyl, cyclopentyl, cyclohexyl, norbornyl and adamantyl. The aryl groups include phenyl, naphthyl and biphenylyl. The aralkyl groups include benzyl and phenethyl.

Suitable substituents include oxo, $C_1$-$C_{12}$ saturated hydrocarbyl groups, $C_1$-$C_{12}$ saturated hydrocarbyloxy groups, $C_6$-$C_{24}$ aryl groups, $C_7$-$C_{25}$ aralkyl groups, $C_6$-$C_{12}$ aryloxy groups, and $C_6$-$C_{24}$ arylthio groups. Notably, the saturated hydrocarbyl group and hydrocarbyl moiety in the saturated hydrocarbyloxy group may be straight, branched or cyclic, and examples thereof are as exemplified above for the saturated hydrocarbyl group $R^{101}$ to $R^{105}$.

Preferred examples of $R^{101}$ to $R^{105}$ include optionally substituted saturated hydrocarbyl groups such as methyl, ethyl, propyl, butyl, cyclohexyl, norbornyl, adamantyl and 2-oxocyclohexyl; optionally substituted aryl groups such as phenyl, naphthyl, biphenylyl, 2-, 3- or 4-methoxyphenyl, 2-, 3- or 4-ethoxyphenyl, 3- or 4-tert-butoxyphenyl, 2-, 3- or 4-methylphenyl, 2-, 3- or 4-ethylphenyl, 4-tert-butylphenyl, 4-butylphenyl, dimethylphenyl, terpbenylyl, biphenylyloxyphenyl, and biphenylylthiophenyl; and optionally substituted aralkyl groups such as benzyl and phenethyl. Of these, optionally substituted aryl groups and optionally substituted aralkyl groups are more preferred.

Examples of the non-nucleophilic counter ion include halide ions such as chloride and bromide; fluoroalkkanesulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkanesulfonate ions such as mesylate and butanesulfonate; fluoroalkanesulfonimide ions such as trifluoromethanesulfonimide; fluoroalkanesulfonylmethide ions such as tris(trifluoromethanesulfonyl)methide; borate ions such as tetrakisphenylborate and tetrakis(pentafluorophenyl)borate; and phosphate ions such as hexafluorophosphate and tris(pentafluoroethyl)trifluorophosphate.

Exemplary diazomethane derivatives include compounds having the formula (C3).

[Chem. 18]

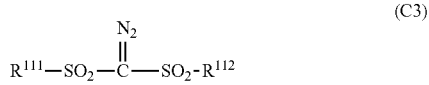

(C3)

In formula (C3), $R^{111}$ and $R^{112}$ are each independently a $C_1$-$C_{12}$ saturated hydrocarbyl group, $C_1$-$C_{12}$ halogenated saturated hydrocarbyl group, optionally substituted $C_6$-$C_{12}$ aryl group, or $C_7$-$C_{12}$ aralkyl group.

The saturated hydrocarbyl group may be straight, branched or cyclic, and examples thereof are as exemplified above for the saturated hydrocarbyl groups $R^{101}$ to $R^{105}$. Examples of the halogenated saturated hydrocarbyl group include trifluoromethyl, 1,1,1-trifluoroethyl, 1,1,1-trichloroethyl, and nonafluorobutyl.

Examples of the optionally substituted aryl group include phenyl; alkoxyphenyl groups such as 2-, 3- or 4-methoxyphenyl, 2-, 3- or 4-ethoxyphenyl, 3- or 4-tert-butoxyphenyl; alkylphenyl groups such as 2-, 3- or 4-methylphenyl, 2-, 3- or 4-ethylphenyl, 4-tert-butylphenyl, 4-butylphenyl, and dimethylphenyl; and halogenated aryl groups such as fluorophenyl, chlorophenyl, and 1,2,3,4,5-pentafluorophenyl. Examples of the aralkyl group include benzyl and phenethyl.

Examples of the onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl) sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexyhnethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, 4-(phenylthio)phenyldiphenylsulfonium tris(pentafluoroethyl)trifluorophosphate, diphenyl(4-thiophenoxyphenyl)sulfonium hexafluoroantimonate, [4(-4-biphenylylthio)phenyl]-4-biphenylylphenylsulfonium tris(trifluoromethanesulfonyl)methide, triphenylsulfonium tetrakis(fluorophenyl)borate, tris[4-(4-acetylphenyl)thiophenyl]sulfonium tetrakis (fluorophenyl)borate, triphenylsulfonium tetrakis (pentafluorophenyl)borate, and tris[4-(4-acetylphenyl)thiophenyl]sulfonium tetrakis(pentafluorophenyl)borate.

Examples of the diazomethane derivatives include bis (benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl) diazomethane, bis(n-butylsulfonyl)diazomethane, bis (isobutylsulfonyl)diazomethane, bis(sec-bulsulfonyl) diazomethane, bis(n-propylsulfonyl)diazomethane, bis (isopropylsulfonyl)diazomethane, bis(tert-butsulfonyl) diazomethane, bis(n-pentylsulfonyl)diazomethane, bis (isopentylsulfonyl)diazomethane, bis(sec-pentylsulfonyl) diazomethane, bis(tert-pentylsulfonyl)diazomethane, 1-cyclohexylsulfonyl-1-(tert-butylsulfonyl)diazomethane, 1-cyclohexylsulfonyl-1-(tert-pentylsulfonyl)diazomethane, and 1-tert-pentylsulfonyl-1-(tert-butylsulfonyl)diazomethane.

Examples of the glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfbnyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Examples of the β-ketosulfone derivatives include 2-cyclohexylcarbonyl-2-(p-toluenesulfonyl)propane and 2-isopropylcarbonyl-2-(p-toluenesulfonyl)propane.

Examples of the disulfone derivatives include diphenyl disulfone and dicyclohexyl disulfone.

Examples of the nitrobenzyl sulfonate derivatives include 2,6-dinitrobenzyl p-toluenesulfonate and 2,4-dinitrobenzyl p-toluenesulfonate.

Examples of the sulfonic acid ester derivatives include 1,2,3-tris(methanesulfonyloxy)benzene, 1,2,3-tris(trifluoromethanesuifonyloxy)benzene, and 1,2,3-tris(p-toluenesulfonyloxy)benzene.

Examples of the imidoyl sulfonate derivatives include phthalimidoyl triflate, phthalimidoyl tosylate, 5-norbornene-2,3-dicarboxyimidoyl triflate. 5-norbornene-2,3-dicarboxyimidoyl tosylate. 5-norbornene-2,3-dicarboxyimidoyl n-butylsulfonate, and n-trifluoromethylsulfonyloxynaphthylimide.

Typical of the oxime sulfonate derivative are α-(benzenesulfoniumoxyimino)-4-methylphenylacetonitrile and α-(p-tolylsulfoniumoxyimino)-p-methoxyphenylacetonitrile.

Examples of the iminosulfonate derivatives include (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)acetonitrile.

Also useful is 2-methyl-2[(4-methylphenyl)sulfonyl]-1-[(4-methylthio)phenyl]-1-propane.

As component (C) or PAG, the onium salts are preferred, with the salfonium salts being more preferred.

Component (C) is preferably used in an amount of 0.05 to 20 parts by weight, more preferably 0.05 to 5 parts by weight per 100 parts by weight of component (A). An amount of component (C) of at least 0.05 part by weight is preferable in that a sufficient amount of acid generates for crosslinking reaction to run to a full extent. An amount of component (C) of up to 20 parts by weight is effective for restraining the PAG from increasing its own absorptivity and eliminating the risk that the problem of transparency decline arises. Component (C) may be used alone or in admixture of two or more.

(D) Crosslinker

Preferably, the photosensitive resin composition of the invention further comprises (D) a crosslinker. The crosslinker undergoes condensation reaction with phenolic hydroxy groups in component (A) or saturated hydrocarbyloxy groups represented by $R^{13}$, $R^{14}$, $R^{23}$ or $R^{24}$, and functions to facilitate pattern formation and to further increase the strength of the cured composition.

The crosslinker is preferably selected from melamine, guanamine, glycoluril and urea compounds having on the average at least two methylol and/or alkoxymethyl groups in the molecule, amino condensates modified with formaldehyde or formaldehyde-alcohol, phenol compounds having on the average at least two methylol or alkoxymethyl groups in the molecule, and epoxy compounds having on the average at least two epoxy groups in the molecule.

Suitable melamine compounds include those having the formula (D1).

[Chem. 19]

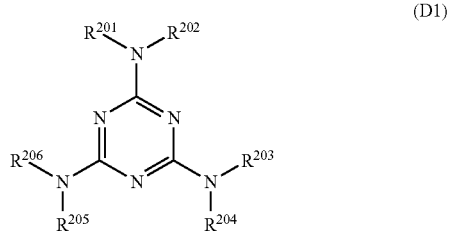

In formula (D1), $R^{201}$ to $R^{206}$ are each independently a methylol group, $C_2$-$C_5$ saturated hydrocarbyloxymethyl group or hydrogen, at least one of $R^{201}$ to $R^{206}$ to being methylol or saturated hydrocarbyloxymethyl group. Suitable saturated hydrocarbyloxymethyl groups include alkoxymethyl groups such as methoxy ethyl and ethoxymethyl.

Examples of the melamine compound having formula (D1) include trimethoxymethylmonomethylolmelamine, dimethoxymethylmonomethylolmelamine, trimethylolmelamine, hexamethylolmelamine, hexamethoxymethylmelamine, and hexaethoxymethylmelamine.

The melamine compound having formula (D1) may be obtained, for example, by modifying a melamine monomer with formaldehyde into a methylol form in a well-known manner, and optionally, further modifying it with an alcohol into an alkoxy form. The alcohols used herein are preferably lower alcohols, for example, alcohols having 1 to 4 carbon atoms.

Suitable guanamine compounds include tetramethylolguanamine, tetramethoxymethylguanamine and tetramethoxyethylguanamine.

Suitable glycoluril compounds include tetramethylolglycoluril and tetramethoxymethylglycoluril.

Suitable urea compounds include tetramethylolurea, tetramethoxymethylurea, tetramethoxyethylurea, tetraethoxymethylurea, and tetrapropoxymethylurea.

Examples of the amino condensate modified with formaldehyde or formaldehyde-alcohol include melamine condensates modified with formaldehyde or formaldehyde-alcohol, and urea condensates modified with formaldehyde or formaldehyde-alcohol.

The modified melamine condensates are obtained, for example, by effecting addition polycondensation of a compound having formula (D1) or a polymer (e.g., oligomer such as dimer or trimer) thereof with formaldehyde until a desired molecular weight is reached. The addition polycondensation may be performed by any prior art well-known methods. The modified melamine having formula (D1) may be used alone or in admixture.

Examples of the urea condensate modified with formaldehyde or formaldehyde-alcohol include methoxymethylated urea condensates, ethoxymethylated urea condensates, and propoxymethylated urea condensates.

The modified urea condensates are prepared, for example, by modifying a urea condensate having a desired molecular weight with formaldehyde into a methylol form in a well-known manner, and optionally, further modifying it with an alcohol into an alkoxy form.

Examples of the phenol compound having on the average at least two methylol or alkoxymethyl groups in the molecule include (2-hydroxy-5-methyl)-1,3-benzenedimethanol and 2,2',6,6'-tetramethoxymethylbisphenol A.

Examples of the epoxy compound having on the average at least two epoxy groups in the molecule include bisphenol epoxy resins such as bisphenol A epoxy resins and bisphenol F epoxy resins, novolak epoxy resins such as phenol novolak epoxy resins and cresol novolak epoxy resins, triphenol alkane epoxy resins, biphenyl epoxy resins, dicyclopentadiene-modified phenol novolak epoxy resins, phenol aralkyl epoxy resins, biphenyl aralkyl epoxy resins, naphthalene ring-containing epoxy resins, glycidyl ester epoxy resins, cycloaliphatic epoxy resins, and heterocyclic epoxy resins.

When the composition contains component (D), its amount is preferably 0.5 to 50 parts by weight, more preferably 1 to 30 parts by weight per 100 parts by weight of component (A). At least 0.5 part of component (D) ensures sufficient cine upon light exposure. As long as the amount of component (D) is up to 50 parts, the proportion of component (A) in the photosensitive resin composition is not reduced, allowing the cured composition to exert its effects to the full extent. Component (D) may be used alone or in admixture.

(E) Solvent

The photosensitive resin composition may further contain (E) a solvent. The solvent used herein is not particularly hunted as long as the foregoing, components (A) to (D) and other additives are dissolvable therein. Organic solvents are preferred because the components are effectively dissolvable.

Illustrative examples of the organic solvent include ketones such as cyclohexanone, cyclopentanone and methyl-2-n-pentylketone; alcohols such as 3-methoxybutanol, 3-methyl-3-methoxybutanol, 1-methoxy-2-propanol, and 1-ethoxy-2-propanol; ethers such as propylene glycol monomethyl ether (PGME), ethylene glycol inonomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate., ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and γ-butyrolactone. Of these solvents, ethyl lactate, cyclohexanone, cyclopentanone, PGMEA, γ-butyrolactone, and mixtures thereof are especially preferred because the PAG is most soluble. These solvents may be used alone or in combinations of two or more.

It is preferred from the standpoints of compatibility and viscosity of the photosensitive resin composition that component (E) be used in an amount of 50 to 2,000 parts, more preferably 50 to 1,000 parts, and even more preferably 50 to 100 parts by weight per 100 parts by weight of component (A).

Other Additives

Besides the aforementioned components, the photosensitive resin composition may contain other additives. One exemplary other additive is a surfactant which is commonly used for improving coating properties.

Preferred surfactants are nonionic surfactants, for example, fluorochemical to surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad® FC-430 from 3M, Surflon® S-141 and S-145 from AGC Seimi Chemical Co., Ltd., Unidyne® DS-401, DS-4031, and DS-451 from Daikin Industries Ltd., Megaface® F-8151 from DIC Corp., and X-70-093 from Shin-Etsu Chemical Co., Ltd. Preferred surfactants are Fluorad FC-430 and X-70-093. The amount of the surfactant added is preferably 0.05 to 1 part by weight per 100 parts by weight of component (A).

The photosensitive resin composition may contain a silane coupling agent as the other additive. Inclusion of a silane coupling agent is effective for enhancing the adhesion of a coating of the composition to adherends. Suitable silane coupling agents include epoxy-containing silane coupling agents and aromatic group-containing aminosilane coupling agents. The silane coupling agent may be used alone or in admixture. Although the amount of the silane coupling agent used is not particularly limited, the amount of the silane coupling agent, when used, is preferably 0.01 to 5% by weight of the photosensitive resin composition.

The photosensitive resin composition is prepared by the standard method. For example, the photosensitive resin composition may be prepared by stirring and mixing the aforementioned components and if necessary, filtering off solids through a filter or the like.

The photosensitive resin composition as prepared above is advantageously used, for example, as a: film-forming material for semiconductor device protective film, interconnection protective film, coverlay film, solder mask, and TSV dielectric film, and an adhesive between substrates in three-dimensional laminates.

Pattern Forming Process Using Photosensitive Resin Composition

Another embodiment of the invention is a pattern forming process using the photosensitive resin composition, comprising the steps of:
(i) applying the photosensitive resin composition onto a substrate to form a photosensitive resin coating thereon,
(ii) exposing the photosensitive resin coating to radiation, and
(iii) developing the exposed resin coating in a developer to form a pattern of the resin coating.

In step (i), the photosensitive resin composition is applied onto a substrate to form a photosensitive resin coating thereon. Examples of the substrate include silicon wafers, TSV silicon wafers, silicon wafers which have been thinned by back side polishing, plastic substrates, ceramic substrates, and substrates having a metal coating of Ni or Au wholly or partly on the surface by ion sputtering or plating. SometiMes, stepped substrates are used.

A method of forming the photosensitive resin coating is, for example, by coating the photosensitive resin composition onto a substrate and, if necessary, prebaking the coating. The coating technique may be any well-known technique, for example, dipping, spin coating, roll coating or the like. The coating weight of the photosensitive resin composition may be selected as appropriate for a particular purpose, preferably so as to form a photosensitive resin coating having a thickness of 0.1 to 200 μm, more preferably 1 to 150 μm.

A pre-wetting technique of dispensing a solvent dropwise on a substrate prior to coating of the photosensitive resin composition may be employed for the purpose of making the coating thickness on the substrate surface more uniform. The type and amount of the solvent dispensed dropwise may be selected for a particular purpose. For example, alcohols such as isopropyl alcohol (IPA), ketones such as cyclohexanone, and glycols such as PGME are preferred. The solvent used in the photosensitive resin composition may also be used.

At this point, the coating may be prebaked to evaporate off the solvent and the like, if necessary, so that the coating is ready for efficient photo-cure reaction. Prebake may be performed, for example, at 40 to 140° C. for 1 minute to about 1 hour.

Next, in step (ii), the photosensitive resin coating is exposed to radiation. The exposure radiation is preferably of wavelength 10 to 600 nm, more preferably 190 to 500 nm. Examples of radiation in the wavelength range include radiation of various wavelengths from radiation-emitting units, specifically UV radiation such as g-line, h-line or i-line, and deep UV (248 nm, 193 nm). Among these, radiation of wavelength 248 to 436 nm is preferred. An appropriate exposure dose is 10 to 10,000 mJ/cm$^2$.

Exposure may be made through a photomask. The photomask may be, for example, one perforated with a desired pattern. Although the material of the photomask is not particularly limited, a material capable of shielding radiation in the above wavelength range. For example, a mask having a light-shielding film of chromium is preferred.

The next step may be post-exposure bake (PEB) which is effective for enhancing development sensitivity. PEB is preferably performed at 40 to 150° C. for 0.5 to 10 minutes. The exposed region of the resin coating is crosslinked by PEB to form an insolubilized pattern which is insoluble in an organic solvent as developer.

The exposure or PEB is followed by the step (iii) of developing the exposed resin coating in a developer to form a pattern of the resin coating. The preferred developers are organic solvents including alcohols such as IPA, ketones such as cyclohexanone, and glycols such as PGME. The solvent used in the photosensitive resin composition is also useful. Development is performed in a conventional manner, for example, by dipping the potentially patterned coating in the developer. The unexposed region of the resin coating is dissolved away by organic solvent development, forming a pattern. The development is followed by washing, rinsing and drying if necessary. In this way, a resin coating having the desired pattern is obtained.

In step (iv), the patterned coating may be post-cured in an oven or on a hot plate at a temperature of preferably 100 to 250° C., more preferably 150 to 220° C. A post-cure temperature of 100 to 250° C. is effective for increasing the crosslinking density of the resin composition and removing any residual volatile matter, which is preferred from the standpoints of adhesion to substrates, heat resistance, mechanical strength, electric properties, and bond strength. The post-cure time is preferably 10 minutes to 10 hours, more preferably 10 minutes to 3 hours. The photosensitive resin composition ensures that a coating having improved film properties is obtained from post-cure at a relatively low temperature around 200° C. The resin coating as post-cured (or cured coating) has a thickness of 1 to 200 μm, preferably 5 to 50 μm.

When it is unnecessary to form a pattern, for example, when it is simply desired to form a uniform film, the same pattern forming process as above may be followed except that in step (ii), the resin coating is exposed to radiation of suitable wavelength without the photomask.

Substrate Bonding Method

The photosensitive resin composition of the invention may also be used as an adhesive for bonding two substrates. The substrate bonding method may be a method of joining a first substrate having a coating of the resin composition formed thereon to a second substrate under a sufficient set of temperature and pressure conditions to form an adhesive bond between the substrates. One or both of the first substrate having a resin coating and the second substrate may have been cut into a chip such as by dicing. The preferred bonding conditions include a temperature of 50 to 200° C. and a time of 1 to 60 minutes. Any desired bonding units may be used, for example, a wafer bonder for bonding wafers under reduced pressure and under a certain load, or a flip chip bonder for performing chip-wafer or chip-chip bonding. The adhesive layer between substrates may be subjected to post-cure treatment into a permanent bond having augmented bond strength.

The thus joined or bonded substrates may be post-cured under the same conditions as in the above step (iv), for thereby increasing the crosslinking density of the resin coating to enhance substrate bonding force. It is noted that crosslinking reaction occurs by the heat during bonding. Since this crosslinking reaction is not accompanied with side reaction entailing degassing, no bonding voids are induced when the photosensitive resin composition is used as the substrate adhesive.

Photosensitive Dry Film

A further embodiment of the invention is a photosensitive dry film comprising a support and the photosensitive resin coating of the photosensitive resin composition thereon.

The photosensitive dry film (support+photosensitive resin coating) is solid, and the photosensitive resin coating contains no solvent. This eliminates the risk that bubbles resulting from volatilization of solvent are left within the resin coating and between the resin coating and the rugged substrate surface.

The photosensitive resin coating has a thickness of preferably 5 to 200 μm, more preferably 10 to 100 μm when planarity and step coverage on a stepped or rugged substrate and a substrate lamination spacing are taken into account.

Furthermore, the viscosity and fluidity of the photosensitive resin coating are closely correlated. As long as the photosensitive resin coating has a proper range of viscosity, it exhibits a sufficient fluidity to till deeply even in a narrow gap or it softens to enhance the adhesion to the substrate. Accordingly, from the standpoint of fluidity, the photosensitive resin coating should preferably have a viscosity in the range of 10 to 5,000 Pa·s, more preferably 30 to 2,000 Pa·s, and even more preferably 50 to 300 Pa·s at a temperature of 80 to 120° C. It is noted that the viscosity is measured by a rotational viscometer.

The photosensitive thy film has the advantage that when tightly attached to a substrate having asperities on its surface, the photosensitive resin coating is coated so as to conform to the asperities, achieving a high flatness. Since the photosensitive resin coating is characterized by a low viscoelasticity, a higher flatness is achievable. Further, if the photosensitive resin coating is in close contact with the substrate in a vacuum environment, generation of gaps therebetween is effectively inhibited.

The photosensitive dry film may be manufactured by coating the photosensitive resin composition to a support and drying the resin composition into a resin coating. An apparatus for manufacturing the photosensitive dry film may be a film coater commonly used in the manufacture of pressure-sensitive adhesive products. Suitable film coaters include, for example, a comma coater, comma reverse coater, multiple coater, die coater, lip coater, lip reverse coater, direct gravure coater, offset gravure coater, three-roll bottom reverse coater, and four-roll bottom reverse coater.

The support (film) is unwound from a supply roll in the film coater, passed across the head of the film coater where the photosensitive resin composition is coated onto the support to the predetermined buildup, and then moved through a hot air circulating oven at a predetermined temperature for a predetermined time, where the photosensitive resin coating is dried on the support, obtaining a photosensitive dry film. If necessary, the photosensitive dry film and a protective film which is unwound from another supply roll in the film coater are passed across a laminate roll under a predetermined pressure whereby the protective film is bonded to the photosensitive resin coating on they support, whereupon the laminate is wound up on a take-up shaft in the film coater, obtaining a protective film-bearing photosensitive dry film. Preferably, the oven temperature is 25 to 150° C., the pass time is 1 to 100 minutes, and the bonding pressure is 0.01 to 5 MPa.

The support film used herein may be a single film or a multilayer film consisting of a plurality of stacked layers. Examples of the film material include synthetic resins such as polyethylene, polypropylene, polycarbonate and polyethylene terephthalate (PET), with the PET film being preferred for appropriate flexibility, mechanical strength and heat resistance. These films may have been pretreated such as by corona treatment or coating of a release agent. Such films are commercially available, for example, Cerapeel® WZ(RX) and Cerapeel® BX8® from Torah Advanced Film Co., Ltd.; E7302 and E7304 from Toyobo Co., Ltd.; Purer® G31 and Purex® G71T1 from Teijin DuPont Films Japan Ltd.; and PET38x1-A3, PET38x1-V8 and PET38x1-X08 from Nippa Co., Ltd.

The protective film used herein may be similar to the support film. Among others, PET and polyethylene films having an appropriate flexibility are preferred. Such films are also commercially available. For example, PET films are as mentioned above, and polyethylene films include GF-8 from Tamapoly Ltd. and PE film 0 type from Nippa Co., Ltd.

Both the support and protective films preferably have a thickness of 10 to 100 μm, more preferably 25 to 50 μm, for consistent manufacture of photosensitive dry film, and prevention of wrapping or curling on a take-up roll.

Pattern Forming Process Using Photosensitive Dry Film

A further embodiment of the invention is a pattern forming process using the photosensitive dry film, comprising the steps of
  (i') using the photosensitive dry film to form the photosensitive resin coating on a substrate,
  (ii) exposing the photosensitive resin coating to radiation,
  (iii) developing the exposed resin coating in a developer to form a pattern of the resin coating.

In step (i'), the photosensitive dry film is used to form the photosensitive resin coating on a substrate. Specifically, the photosensitive dry film at its photosensitive resin coating is attached to a substrate to form the photosensitive resin coating on the substrate. When the photosensitive dry film is covered with the protective film, the dry film at its photosensitive resin coating is attached to a substrate after stripping the protective film therefrom, to form the photosensitive resin coating on the substrate. The dry film may be attached using a film attachment apparatus.

Examples of the substrate include the same substrates as exemplified above in the pattern forming process using the photosensitive resin composition. The film attachment apparatus is preferably a vacuum laminator. The photosensitive thy film is mounted in the film attachment apparatus where the protective film is stripped from the dry film. In the vacuum chamber kept at a predetermined vacuum, the bare photosensitive resin coating of the dry film is closely bonded to the substrate on a table at a predetermined temperature, using a bonding roll under a predetermined pressure. Preferably, the temperature is 60 to 120° C., the pressure is 0 to 5.0 MPa, and the vacuum is 50 to 500 Pa.

The attachment of dry film may be repeated plural times, if necessary to obtain a photosensitive resin coating having the desired thickness. The attachment step is repeated 1 to 10 times, for example, before a photosensitive resin coating having a thickness of the order of about 10 to 1,000 μm, preferably about 100 to 500 μm is obtained.

The assembly of the photosensitive resin coating on the substrate may be prebaked, if necessary, for facilitating, photo-cure reaction of the photosensitive resin coating or enhancing the adhesion between the resin coating and the substrate. Prebake may be, for example, at 40 to 140° C. for about 1 minute to about 1 hour.

Like the pattern forming process using the photosensitive resin composition, the photosensitive resin coating attached to the substrate may be subjected to steps of (ii) exposing the photosensitive resin coating to radiation, (iii) developing the exposed resin coating in a developer to form as pattern of the resin coating and optionally (iv) post-curing the patterned coating. It is noted that the support of the photosensitive dry film may be removed before prebake or before PEB, by mechanical stripping, or the like, depending on a particular process.

The resin coating obtained from the photosensitive resin composition or photosensitive dry film has excellent properties including heat resistance, flexibility, electric insulation, mechanical properties, and substrate adhesion. The resin coating is thus best suited as a protective film for electric and electronic parts such as semiconductor devices and as a substrate bonding film.

EXAMPLES

Synthesis Examples, Examples and Comparative Examples are given below for illustrating the invention although the invention is not limited thereto. Notably, the Mw is measured by GPC versus monodisperse polystyrene standards using GPC column TSKgel Super HZM-H (Tosoh Corp.) under analytical conditions: flow rate 0.6 mL/min, THF elute, and column temperature 40° C.

Compounds (S-1) to (S-6) used in Synthesis Examples are shown below.

[Chem. 20]

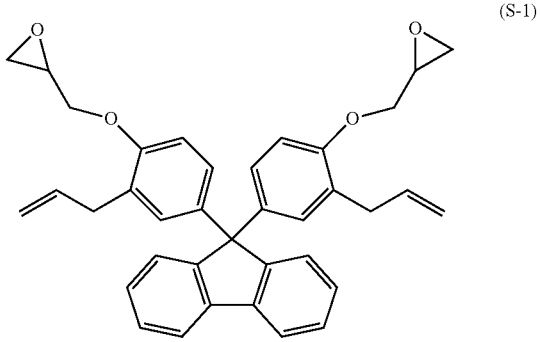

(S-1)

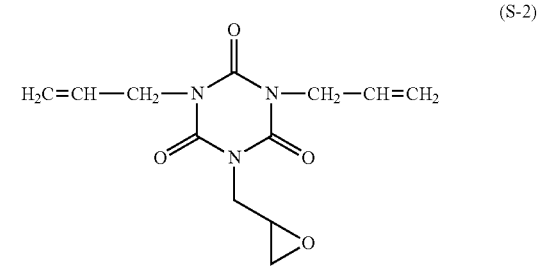

(S-2)

-continued

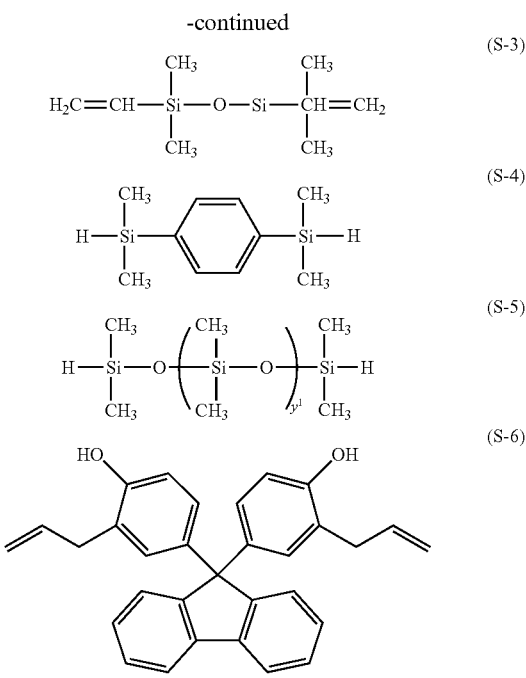

[1] Synthesis of Silicone Resins

Synthesis Example 1

A 3-L flask equipped with a stirrer, thermometer, nitrogen purge line and reflux condenser was charged with 215.0 g (0.5 mol) of Compound (S-6), then with 2,000 g of toluene and heated at 70° C. Thereafter, 1.0 g of a toluene solution of chloroplatinic acid (platinum concentration 0.5 wt %) was added, and 67.9 g (0.35 mol) of Compound (S-4) and 453.0 g (0.15 mol) of Compound (S-5) wherein $y^1$=40 (by Shin-Etsu Chemical Co., Ltd.) were added dropwise over 1 hour. The molar ratio of the total of hydrosilyl groups to the total of alkenyl groups was 1/1. At the end of dropwise addition, the reaction solution was heated at 100° C. and aged for 6 hours. Toluene was distilled off inn vacuum from the reaction solution, yielding Resin 1. On 1H-NMR spectroscopy (Biuker Corp.), Resin 1 was identified to contain repeat units (a1), (a2), (b1), and (b2). Resin 1 had a Mw of 62,000 and a silicone content of 61.6% by weight.

Synthesis Example 2

A 3-L flask equipped with a stirrer, thermometer, nitrogen purge line and reflux condenser was charged with 53.00 g (0.20 mol) of Compound (S-2) and 117.6 g (0.30 mol) of Compound (S-1), then with 2,000 g of toluene and heated at 70° C. Thereafter, 1.0 g of a toluene solution of chloroplatinic acid (platinum concentration 0.5 wt %) was added, and 48.5 g (0.25 mol) of Compound (S-4) and 755.0 g (0.25 mol) of Compound (S-5) wherein $y^1$=40 (by Shin-Etsu Chemical Co., Ltd.) were added dropwise over 1 hour. The molar ratio of the total of hydrosilyl groups to the total of alkenyl groups was 1/1. At the end of dropwise addition, the reaction solution was heated at 100° C. and aged for 6 hours. Toluene was distilled off in vacuum from the reaction solution, yielding Resin 2. On $^1$H-NMR spectroscopy (Breaker Corp.), Resin 2 was identified to contain repeat units (a1), (a3), (a4), (b1), (b3), and (b4). Resin 2 had a Mw of 83,000 and a silicone content of 77.5% by weight.

Synthesis Example 3

A 3-L flask equipped with a stirrer, thermometer, nitrogen purge line and reflux condenser was charged with 27.9 g (0.15 mol) of Compound (S-3), 19.6 g (0.05 mol) of Compound (S-1), and 129.0 g (0.30 mol) of Compound (S-6), then with 2,000 g of toluene and heated at 70° C. Thereafter, 1.0 g of a toluene solution of chloroplatinic acid (platinum concentration 05 wt %) was added, and 87.3 g (0.45 mol) of Compound (S-4) and 79.3 g (0.05 mol) of Compound (S-5) wherein $y^1$=20 (by Shin-Etsu Chemical Co., Ltd) were added dropwise over 1 hour. The molar ratio of the total of hydrosilyl groups to the to total of alkenyl groups was 1/1. At the end of dropwise addition, the reaction solution was heated at 100° C. and aged for 6 hours. Toluene was distilled off in vacuum from the reaction solution, yielding Resin 3. On $^1$HNMR spectroscopy (Balker Corp.), Resin 3 was identified to contain repeat units (a11), (a2), (a4), (b1), (b2), and (b4). Resin 3 had a Mw of 24,000 and a silicone content of 31.2% by weight.

[2] Preparation of Photosensitive Resin Composition

Examples 1 to 9 and Comparative Examples 1 to 12

Photosensitive resin compositions of Examples 1 to 9 and Comparative Examples 1 to 12 were prepared by blending the components in the amounts shown in Tables 1 and 2, agitating them at room temperature until dissolution, and precision filtering through a Teflon® filter with a pore size of 1.0 μm.

TABLE 1

| Component (pbw) | | | Example | | | | | | | | |
|---|---|---|---|---|---|---|---|---|---|---|---|
| | | | 1 | 2 | 3 | 4 | 5 | 6 | 7 | 8 | 9 |
| (A) | Silicone resin | Resin 1 | | | | 100 | | 100 | | | 100 |
| | | Resin 2 | 100 | 100 | | | | | 100 | | |
| | | Resin 3 | | | 100 | | 100 | | | 100 | |
| (B) | Phenol novolak resin | B-1 | 5 | | | 100 | | 100 | | | 30 |
| | | B-2 | | 5 | | | 30 | | 50 | | |
| | | B-3 | | | 5 | | | | | 50 | |
| (C) | Photoacid generator | PAG-1 | 1 | 1 | 1 | 1 | 1 | 1 | 1 | 1 | 5 |

TABLE 1-continued

| Component (pbw) | | 1 | 2 | 3 | 4 | 5 | 6 | 7 | 8 | 9 |
|---|---|---|---|---|---|---|---|---|---|---|
| (D) Crosslinker | CL-1 | | | | 50 | 10 | | | | 20 |
| | CL-2 | | | | | | 50 | 30 | 10 | 20 |
| (E) Solvent | cyclopentanone | 55 | 55 | 55 | 55 | 55 | 55 | 55 | 55 | 55 |

TABLE 2

| Component (pbw) | | Comparative Example | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| (A) Silicone resin | Resin 1 | 100 | | | 100 | | | | | 100 | | | |
| | Resin 2 | | 100 | | | 100 | | 100 | | | 100 | | |
| | Resin 3 | | | 100 | | | 100 | | 100 | | | 100 | 100 |
| (B) Phenol novolak resin | B-4 | | | | | | | 5 | | 100 | | 30 | |
| | B-5 | | | | | | | | 5 | | 100 | | 30 |
| (C) Photoacid generator | PAG-1 | 1 | 1 | 1 | 1 | 1 | 1 | 1 | 1 | 1 | 1 | 1 | 1 |
| (D) Crosslinker | CL-1 | | | | 20 | | 10 | | | 50 | | 20 | 20 |
| | CL-2 | | | | | 20 | 10 | | | | 50 | 20 | 20 |
| (E) Solvent | cyclopentanone | 55 | 55 | 55 | 55 | 55 | 55 | 55 | 55 | 55 | 55 | 55 | 55 |

In Tables 1 and 2, phenol novolak resins B-1 to B-5 are identified below.

[Chem. 21]

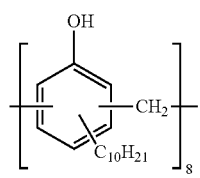

B-1

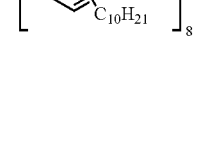

B-2

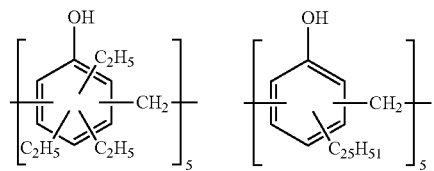

B-3

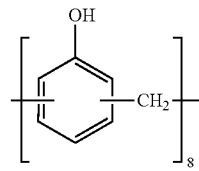

B-4

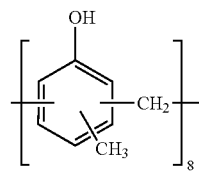

B-5

In Tables 1 and 2, photoacid generator PAG-1 is identified below.

[Chem. 22]

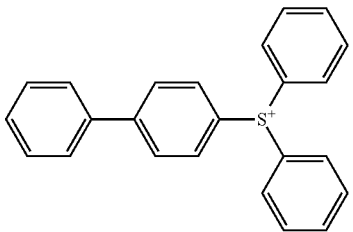

PAG-1

In Tables 1 and 2, crosslinkers CL-1 and CL-2 are identified below.

[Chem. 23]

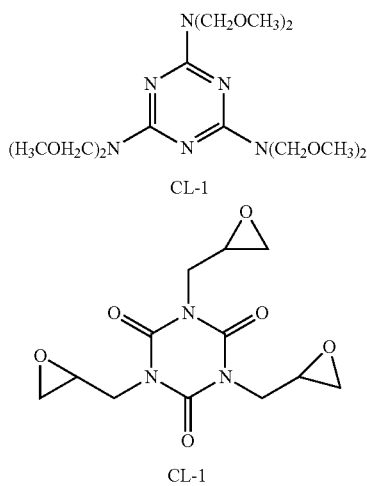

CL-1

CL-1

[3] Preparation of Photosensitive Dry Film

A die coater was used as the film coater and a polyethylene terephthalate (PET) film of 38 μm thick used as the support film. Each of the photosensitive resin compositions in Tables 1 and 2 was coated onto the support film. The coated film was passed through a hot air circulating oven (length 4 m) set at 100° C. over 5 minutes to form a photosensitive resin coating on the support film, yielding a photosensitive dry film. Using a laminating roll, a polyethylene film of 50 μm thick as the protective film was bonded to the photosensitive resin coating under a pressure of 1 MPa, yielding a protective film-bearing photosensitive dry film. Each photosensitive resin coating had a thickness of 100 μm. The thickness of a resin coating was measured by an optical interference film thickness gauge.

[4] Evaluation of Resin Coating (1) Pattern Formation and Evaluation

From the protective film-bearing photosensitive dry film, the protective film was stripped off. Using a vacuum laminator TEAM-100RF (Takatori Corp.) with a vacuum chamber set at a vacuum of 80 Pa, the photosensitive resin coating on the support film was closely bonded to a migration test substrate (comb-shaped electrode-bearing substrate, conductor: copper, conductor spacing and width: 20 μm, conductor thickness: 4 μm). The temperature was 110° C. After restoration of atmospheric pressure, the substrate was to taken out of the laminator, and the support film was stripped off. Then the photosensitive resin coating was prebaked on a hot plate at 130° C. for 5 minutes for enhancing its adhesion to the substrate. Next, using a contact aligner exposure tool, the photosensitive resin coating was exposed to radiation of 405 nm through a mask having a line-and-space pattern and a contact hole pattern. After exposure, the coated substrate was baked (PEB) on a hot plate at 120° C. for 5 minutes and cooled. This was followed by spray development in PGMEA for 300 seconds for forming a pattern of the resin coating.

The patterned photosensitive resin coating on the substrate was post-cured in an oven at 180° C. for 2 hours while the oven was purged with nitrogen. Under a scanning electron microscope (SEM), the contact hole patterns of 100 μm, 80 μm, 60 μm, 40 μm, and 20 μm were observed in cross section, with the minimum hole pattern in which holes extended down to the film bottom being reported as maximum resolution. From the cross-sectional photo, the contact hole pattern of 100 μm was evaluated for perpendicularity, and rated excellent (⊚) for perpendicular pattern, good (○) for slightly inversely tapered profile, fair (Δ) for inversely tapered profile, and poor (χ) for opening failure.

(2) Evaluation of Electric Properties (Dielectric Breakdown Strength)

For the evaluation of dielectric breakdown strength of a photosensitive resin coating of a photosensitive resin composition, each of the photosensitive resin compositions in. Tables 1 and 2 was coated onto a steel plate of 13 cm×15 cm×0.7 mm (thick) by means of a bar coater and heated in an oven at 200° C. for 2 hours to form a photosensitive resin coating. The resin composition was coated such that the resulting coating had a thickness of 0.2 μm. The resin coating was tested on breakdown tester TM-5031AM (Tama Densoku Co., Ltd.) by starting to apply a voltage at a voltage rise rate of 5 V/sec and measuring the voltage at which the specimen was broken, which was reported as the dielectric breakdown strength of the coating.

(3) Evaluation of Reliability (Adhesion, Crack Resistance)

Each of the photosensitive resin film-bearing wafers after pattern formation and post-cure in Examples 1 to 9 and Comparative Examples 1 to 12 was cut into specimens of 10 mm squares using a dicing saw with a dicing blade (DAD685 by DISCO Co., spindle revolution 40,000 rpm, cutting rate 20 mm/sec). Ten specimens for each Example were examined by a thermal cycling test (test of holding at −25° C. for 10 minutes and holding at 125° C. for 10 minutes, the test being repeated 2,000 cycles). After the test, it was observed whether or not the resin film peeled from the wafer and whether or not the resin film cracked. The sample was rated "good" when all specimens did not peel or crack, "peeled" when one or more specimens peeled, and "cracked" when one or more specimens cracked. The means for determining whether or not a specimen peeled or cracked were top-down observation under an optical microscope and cross-sectional observation under SEM.

(4) Evaluation of Heat Resistance

Prior to a heating test, the weight of a specimen (prepared in the above reliability evaluation) was measured. The specimen was held in an oven at 200° C. for 1,000 hours, taken out of the oven, and measured for weight again. The sample was rated good when the weight change before and after the test was less than 1.0%, and poor when the weight change before and after the test was equal to or more than 1.0%. The percent weight change was calculated as [(sample weight before test)−(sample weight after test)]/(sample weight before test).

The test results of the resin coatings of the photosensitive resin compositions in Tables 1 and 2 are tabulated in Tables 3 and 4.

TABLE 3

| | Example | | | | | | | | |
|---|---|---|---|---|---|---|---|---|---|
| | 1 | 2 | 3 | 4 | 5 | 6 | 7 | 8 | 9 |
| Contact hole pattern profile | ○ | ○ | ○ | ◎ | ◎ | ◎ | ◎ | ◎ | ◎ |
| Maximum resolution (μm) | 60 | 60 | 60 | 40 | 40 | 40 | 40 | 40 | 40 |
| Dielectric breakdown strength (V/μm) | 570 | 575 | 565 | 620 | 625 | 630 | 615 | 625 | 620 |
| Reliability Adhesion | Good | Good | Good | Good | Good | Good | Good | Good | Good |
| Crack resistance | Good | Good | Good | Good | Good | Good | Good | Good | Good |
| Heat resistance | Good | Good | Good | Good | Good | Good | Good | Good | Good |

TABLE 4

| | Comparative Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Contact hole pattern profile | X | Δ | Δ | Δ | Δ | Δ | Δ | Δ | Δ | Δ | Δ | Δ |
| Maximum resolution (μm) | — | 100 | 100 | 100 | 100 | 100 | 100 | 100 | 100 | 100 | 100 | 100 |
| Dielectric breakdown strength (V/μm) | 400 | 465 | 470 | 475 | 460 | 480 | 470 | 465 | 480 | 460 | 475 | 475 |
| Reliability Adhesion | Peeled | Peeled | Peeled | Peeled | Peeled | Peeled | Peeled | Peeled | Peeled | Peeled | Peeled | Peeled |
| Crack resistance | Cracked | Cracked | Cracked | Cracked | Cracked | Cracked | Cracked | Cracked | Cracked | Cracked | Cracked | Cracked |
| Heat resistance | Good | Good | Good | Good | Good | Good | Good | Good | Good | Good | Good | Good |

As is evident from the test results, the photosensitive resin compositions within the scope of the invention exhibit good resolution, i.e., sufficient properties as photosensitive material, and the resin coatings obtained therefrom have improved electric properties (e.g., dielectric breakdown strength) and heat resistance, as well as improved adhesion and crack resistance in the thermal cycling test, and are thus useful as protective film for circuits and electronic parts. It is thus demonstrated that photosensitive dry films having more reliability are available.

The invention claimed is:

1. A photosensitive resin composition comprising (A) a silicone resin containing an epoxy group and/or phenolic hydroxy group, the silicone resin having the formula (A):

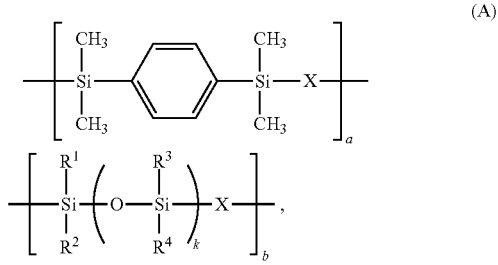

wherein $R^1$ to $R^4$ are each independently a $C_1$-$C_8$ monovalent hydrocarbon group, k is an integer of 1 to 600, a and b are numbers in the range: $0<a<1$, $0<b<1$, and $a+b=1$, and X is a divalent organic group containing an epoxy group and/or phenolic hydroxy group, (B) an alkyl phenol novolak resin having the formula (B):

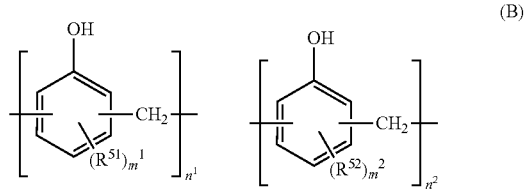

wherein $R^{51}$ is a $C_1$-$C_9$ saturated hydrocarbyl group, $R^{52}$ is a $C_{10}$-$C_{25}$ saturated hydrocarbyl group, $n^1$ and $n^2$ are numbers in the range: $0 \leq n^1 < 1$, $0 < n^2 \leq 1$, and $n^1 + n^2 = 1$, $m^1$ is an integer of 0 to 3, and $m^2$ is an integer of 1 to 3, and (C) a photoacid generator.

2. The photosensitive resin composition of claim 1 wherein the silicone resin (A) comprises repeat units having the formulae (a1) to (a4) and (b1) to (b4):

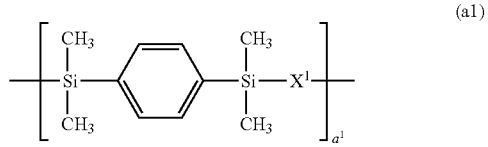

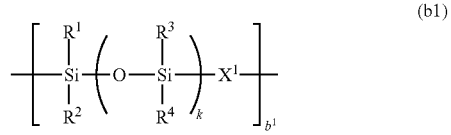

-continued

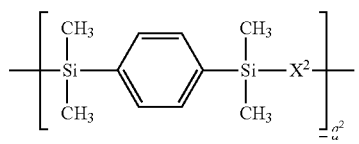
(a2)

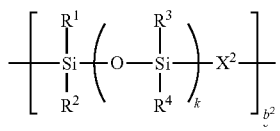
(b2)

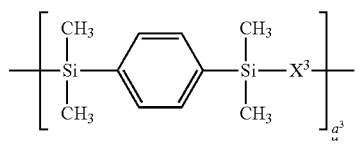
(a3)

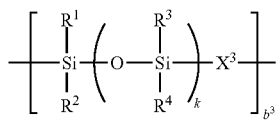
(b3)

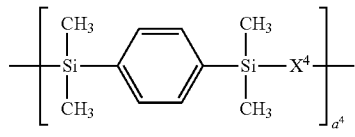
(a4)

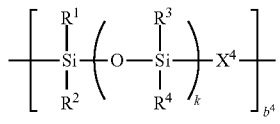
(b4)

wherein $R^1$ to $R^4$ are each independently a $C_1$-$C_8$ monovalent hydrocarbon group, k is an integer of 1 to 600, $a^1$ to $a^4$ and $b^1$ to $b^4$ are numbers in the range: $0 \leq a^1 < 1$, $0 \leq a^2 < 1$, $0 \leq a^3 < 1$, $0 \leq a^4 < 1$, $0 \leq b^1 < 1$, $0 \leq b^2 < 1$, $0 \leq b^3 < 1$, $0 \leq b^4 < 1$, $0 < a^1 + a^2 + a^3 < 1$, $0 < b^1 + b^2 + b^3 < 1$, $a^1 + a^2 + a^3 + a^4 + b^1 + b^2 + b^3 + b^4 = 1$, $X^1$ is a divalent group having the following formula (X1), $X^2$ is a divalent group having the following formula (X2), $X^3$ is a divalent group having the following formula (X3), $X^4$ is a divalent group having the following formula (X4),

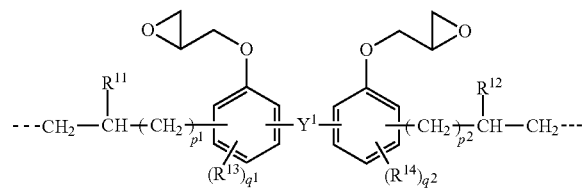
(X1)

wherein $Y^1$ is a single bond, methylene, propane-2,2-diyl, 1,1,1,3,3,3-hexafluoropropane-2,2-diyl or fluorene-9,9-diyl, $R^{11}$ and $R^{12}$ are each independently hydrogen or methyl, $R^{13}$ and $R^{14}$ are each independently a $C_1$-$C_4$ saturated hydrocarbyl or $C_1$-$C_4$ saturated hydrocarbyloxy group, $p^1$ and $p^2$ are each independently an integer of 0 to 7, $q^1$ and $q^2$ are each independently an integer of 0 to 2, the broken line designates a valence bond,

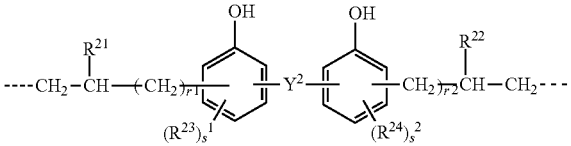
(X2)

wherein $Y^2$ is a single bond, methylene, propane-2,2-diyl, 1,1,1,3,3,3-hexafluoropropane-2,2-diyl or fluorene-9,9-diyl, $R^{21}$ and $R^{22}$ are each independently hydrogen or methyl, $R^{23}$ and $R^{24}$ are each independently a $C_1$-$C_4$ saturated hydrocarbyl or $C_1$-$C_4$ saturated hydrocarbyloxy group, $r^1$ and $r^2$ are each independently an integer of 0 to 7, $s^1$ and $s^2$ are each independently an integer of 0 to 2, the broken line designates a valence bond,

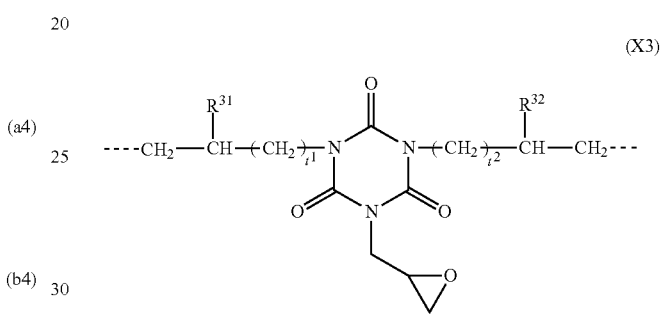
(X3)

wherein $R^{31}$ and $R^{32}$ are each independently hydrogen or methyl, $t^1$ and $t^2$ are each independently an integer of 0 to 7, the broken line designates a valence bond,

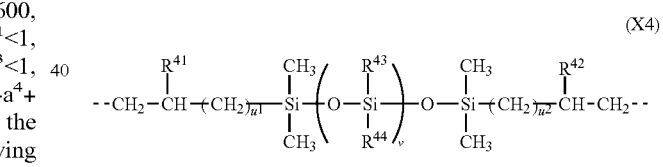
(X4)

wherein $R^{41}$ and $R^{42}$ are each independently hydrogen or methyl, $R^{43}$ and $R^{44}$ are each independently a $C_1$-$C_8$ hydrocarbyl group, $u^1$ and $u^2$ are each independently an integer of 0 to 7, v is an integer of 0 to 600, and the broken line designates a valence bond.

3. The photosensitive resin composition of claim 1 wherein the amount of the alkyl phenol novolak resin as component (B) is 3 to 100 parts by weight per 100 parts by weight of component (A).

4. The photosensitive resin composition of claim 1, further comprising (D) a crosslinker.

5. The photosensitive resin composition of claim 4 wherein the crosslinker (D) is at least one compound selected from a nitrogen-containing compound selected from melamine, guanamine, glycoluril and urea compounds, having on the average at least two methylol and/or alkoxymethyl groups in the molecule, an amino condensate modified with formaldehyde or formaldehyde-alcohol, a phenol compound having on the average at least two methylol or alkoxymethyl groups in the molecule, and an epoxy compound having on the average at least two epoxy groups in the molecule.

6. The photosensitive resin composition of claim 1, further comprising (E) a solvent.

7. The photosensitive resin composition of claim 1 which is capable of use as a coating for protecting electric and electronic parts.

8. The photosensitive resin composition of claim 1 which is capable of use as a substrate-bonding coating for bonding two substrates.

9. A photosensitive resin coating obtained from the photosensitive resin composition of claim 1.

10. A photosensitive dry film comprising a support and the photosensitive resin coating of claim 9 thereon.

11. A pattern forming process comprising the steps of:
  (i) applying the photosensitive resin composition of claim 1 onto a substrate to form a photosensitive resin coating thereon,
  (ii) exposing the photosensitive resin coating to radiation, and
  (iii) developing the exposed resin coating in a developer to form a pattern of the resin coating.

12. The pattern forming process of claim 11, further comprising (iv) post-curing the patterned resin coating resulting from the development step at a temperature of 100 to 250° C.

13. A pattern forming process comprising the steps of:
  (i') attaching the photosensitive resin coating of the photosensitive dry film of claim 10 to a substrate to form the photosensitive resin coating on the substrate,
  (ii) exposing the photosensitive resin coating to radiation, and
  (iii) developing the exposed resin coating in a developer to form a pattern of the resin coating.

* * * * *